(12) United States Patent
Sato et al.

(10) Patent No.: US 7,891,932 B2
(45) Date of Patent: Feb. 22, 2011

(54) STRAIGHT CONVEYING DEVICE FOR VACUUM

(75) Inventors: Soichi Sato, Tsukubamarai (JP);
Takashi Abe, Tsukubamirai (JP); Eiko Miyasato, Tsukubamirai (JP); Migaku Takahashi, Sendai (JP); Masakiyo Tsunoda, Sendai (JP)

(73) Assignees: SMC Corporation, Tokyo (JP); Tohoku University, Sendai-shi (JP)

( * ) Notice: Subject to any disclaimer, the term of this patent is extended or adjusted under 35 U.S.C. 154(b) by 1155 days.

(21) Appl. No.: 11/552,674

(22) Filed: Oct. 25, 2006

(65) Prior Publication Data
US 2007/0107739 A1    May 17, 2007

(30) Foreign Application Priority Data
Nov. 11, 2005    (JP) .............................. 2005-327823

(51) Int. Cl.
*B65G 35/00*    (2006.01)
(52) U.S. Cl. ...................... 414/676; 414/217; 414/935; 414/680
(58) Field of Classification Search ................. 414/676, 414/217, 935, 941
See application file for complete search history.

(56) References Cited

U.S. PATENT DOCUMENTS

| 4,368,495 A | * | 1/1983 | Hamanaka et al. ........ 360/99.06 |
| 4,571,129 A | * | 2/1986 | Strand ........................ 408/54 |
| 7,059,607 B2 | * | 6/2006 | Nakamura et al. .......... 277/432 |

FOREIGN PATENT DOCUMENTS

| JP | 7-205078 | 8/1995 |
| JP | 2002-303323 | 10/2002 |

* cited by examiner

*Primary Examiner*—Saúl J Rodríguez
*Assistant Examiner*—Willie Berry
(74) *Attorney, Agent, or Firm*—Oblon, Spivak, McClelland, Maier & Neustadt, L.L.P.

(57) ABSTRACT

A working rod with a tip end extending into a vacuum process chamber and moving in the axial direction, two static-pressure gas bearings supporting the rod in the non-contact manner, and an internal moving body of a magnet coupling type driving mechanism driving the rod are housed in a rod housing cylindrical portion leading to the vacuum process chamber, and an exhaust portion by suction is provided at a part of the rod housing cylindrical portion so that the pressure of the rod housing cylindrical portion is lowered than the pressure of the vacuum process chamber by the exhaust from the exhaust portion.

14 Claims, 4 Drawing Sheets

STRAIGHT CONVEYING DEVICE FOR VACUUM

TECHNICAL FIELD

The present invention relates to a straight conveying device for vacuum and more specifically to a conveying device for straight conveyance of a work used in a vacuum environment or clean environment.

BACKGROUND ART

As a straight conveying device which can respond to vacuum, such devices are known that is provided with a magnet coupling type non-contact transmission method at a driving force transmission portion and a contact support method such as a sliding bearing and a ball bush at a contact portion (See Patent Document 1, for example).

However, when the contact portion is of a contact support type, there is a problem of a lowered work processing productivity due to limitation on a shift to a higher driving speed in order to avoid drop of cleanliness caused by dust generated with rise of a driving speed and of durability due to progress of bearing abrasion.

Also, such a device is publicly known that a conveying rod is inserted into a vacuum process chamber through an opening provided at the vacuum process chamber, the opening and the conveying rod are sealed by a differential exhaust seal and the differential exhaust seal is constituted in the same housing as a housing of a static-pressure gas bearing supporting the conveying rod (See Patent Document 2, for example).

However, in the device described in Patent Document 2, air flowing out of the static-pressure gas bearing is directly discharged into a chamber where the conveying device is installed, and since the conveying rod is supported by a contact support type bearing such as a ball bush other than the static-pressure gas bearing, generation of dust can not be prevented basically, and the dust generation is increased with rise of the rod driving speed, which lowers the cleanliness of a clean room where the device is installed and durability of the device is lowered by progress of the bearing abrasion, which is a problem.

Japanese Unexamined Patent Application Publication No. 7-205078

Japanese Unexamined Patent Application Publication No. 2002-303323

DISCLOSURE OF INVENTION

A technical object of the present invention is to provide a straight conveying device for vacuum which can solve the above problem and is capable of suppression of cleanliness drop due to dust generation and improvement of driving speed.

Another technical object of the present invention is to provide a straight conveying device for vacuum which can drive a working rod in the non-contact manner and suppresses friction, dust generation and the like involved with sliding of the rod and the rod driving mechanism.

Another technical object of the present invention is to provide a straight conveying device for vacuum which can support the working rod in the non-sliding manner and can fully eliminate dust even if dust is generated in the rod driving mechanism.

In order to solve the above problem, the straight conveying device for vacuum of the present invention comprises a working rod with a tip end extending into a vacuum process chamber and moving in the axial direction, two static-pressure gas bearings supporting the rod in the non-contact manner through an air layer, and an internal moving body of a magnet coupling type driving mechanism driving the rod housed in a rod housing cylindrical portion leading to the vacuum process chamber, an exhaust portion by suction being provided at a part of the rod housing cylindrical portion, the driving mechanism has an external moving body driven by driving means and moved in the axial direction outside the rod housing cylindrical portion and the internal moving body connected to the conveying rod to be magnetically coupled to the external moving body and moved following the external moving body by transmission of a driving force of the external moving body in the non-contact manner, and the exhaust portion being provided at a position between the vacuum process chamber and the static-pressure gas bearings so that a pressure in the rod housing cylindrical portion is lowered by an exhaust from the exhaust portion than the pressure of the vacuum process chamber.

In the present invention, it is preferable that the internal moving body has a body portion to which a magnet for magnetic coupling is attached and disposed in the non-contact state with the inner circumferential face of the rod housing cylindrical portion and a rolling bearing portion provided on both sides of the body portion in the axial direction in rolling contact with the inner circumferential face of the rod housing cylindrical portion.

In this case, the rolling bearing portion has a plurality of rolling elements disposed in the radial state around the axis of the body portion and in rolling contact with the inner circumferential face of the rod housing cylindrical portion and these rolling elements are preferably disposed capable of movement adjustment in the radial direction of the body portion so that the contact pressure on the inner circumferential face can be adjusted by the movement adjustment.

In the present invention, it may be so constructed that the rod and the internal moving body are connected by a floating joint, and the floating joint has a joint member connected to one of the rod or the internal moving body capable of displacement in the direction crossing the shaft center and an oscillation shaft connected to the other and bonded to this joint member capable of oscillation.

Also, in the present invention, a rotation suppression mechanism may be provided for suppressing rotation of the rod. This rotation suppression mechanism has an internal magnet mounted on the rod side and an external magnet mounted on the rod housing cylindrical portion side, and it may be so constructed that magnetic attracting force of the internal magnet and the external magnet suppresses rotation of the rod or it may be constructed by a weight mounted to the rod in the eccentric state.

Moreover, in the present invention, it is preferable that the first static-pressure gas bearing in the above two static-pressure gas bearings is fixedly supported by a bearing housing forming the rod housing cylindrical portion, while the other second static-pressure gas bearing is supported by the bearing housing, capable of displacement in the direction crossing the axis of the rod through the actuator so that by displacing the shaft center of the second static-pressure gas bearing with respect to the first static-pressure gas bearing, contact of the rod with the both static-pressure gas bearings can be prevented.

According to the straight conveying device for vacuum of the present invention, the working rod can be driven in the non-contact manner and friction, dust generation and the like involved with sliding of the rod and the rod driving mechanism can be suppressed. And a straight conveying device for vacuum can be provided which can realize suppression of cleanliness drop caused by dust generation and improvement of driving speed at the same time.

BEST MODE FOR CARRYING OUT THE INVENTION

Figure 1:
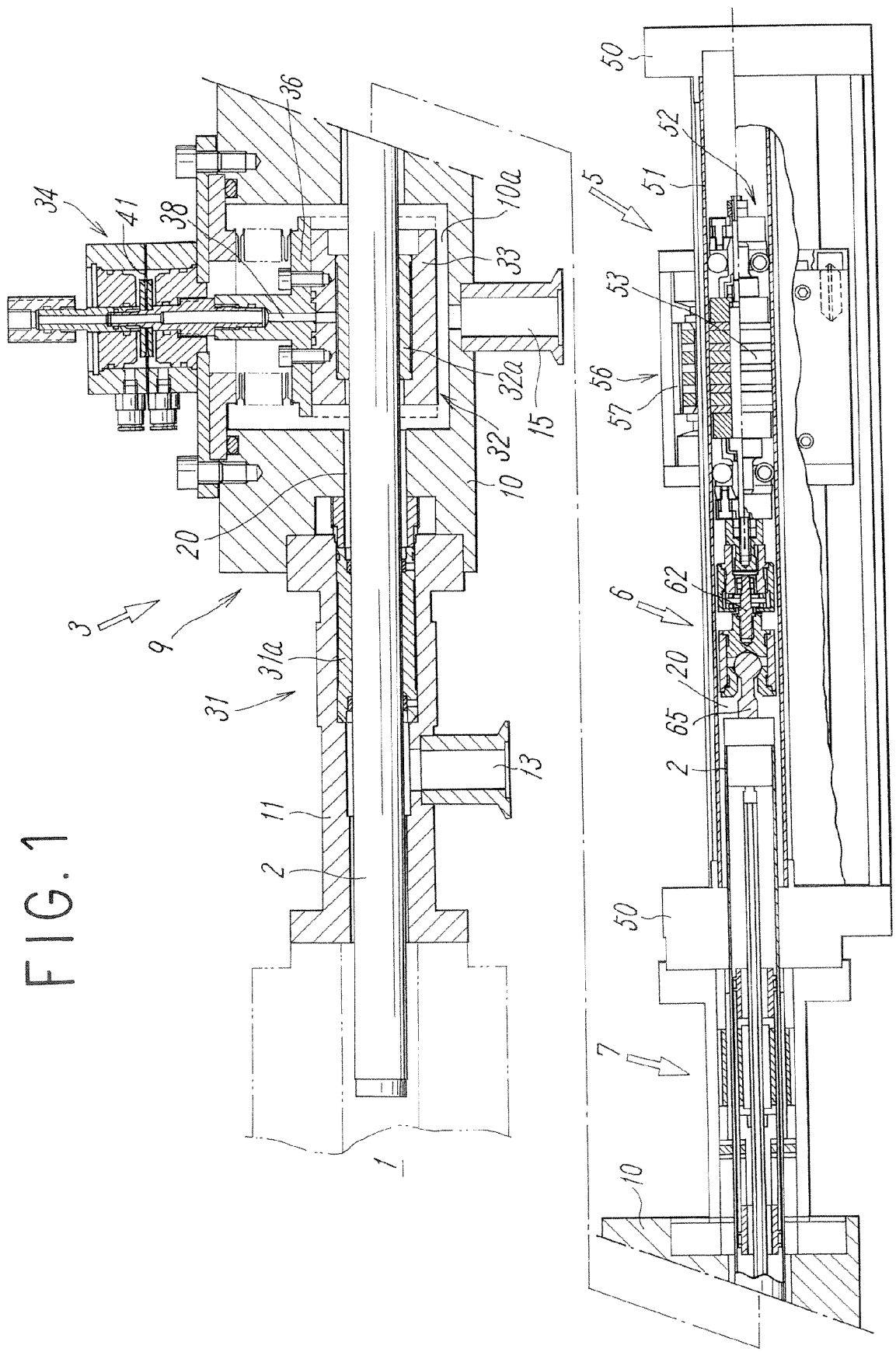
FIG. 1 is a longitudinal sectional view showing an entire construction of an embodiment of a straight conveying device for vacuum according to the present invention.

FIG. 1 shows an embodiment of a straight conveying device for vacuum according to the present invention. As can be seen from the figure, the straight conveying device for vacuum comprises in an outline manner a working rod 2 for horizontal driving for conveying in/out and the like of a work with respect to a vacuum process chamber 1 provided for manufacture of semiconductors and the like, and a tray (not shown) is mounted at the tip end of the rod 2 so as to drive the rod 2 in its axial direction, and also comprises a static-pressure gas bearing mechanism 3 for supporting the horizontally arranged rod 2, a magnet coupling type driving mechanism 5 for driving the rod 2 in its axial direction, a floating joint 6 for connecting an internal moving body 52 of the driving mechanism 5 and the rod 2, and a rotation suppression mechanism 7 for suppressing rotation of the rod 2.

The driving system including the rod 2 is arranged in a rod housing cylindrical portion 20 communicating with the process chamber 1 and constituting a vacuum system, and they are isolated from an outside environment.

More specifically, the rod 2, a housing member in a cylindrical portion in the rotation suppression mechanism 7 connected to that, the floating joint 6, the internal moving body 52 and the like in the magnet coupling type driving mechanism 5 are in the rod housing cylindrical portion 20 formed inside a support block 10, a bearing block 11, a tube 51 and the like, which will be described below.

Here, the rod 2 will be described as a rod with the tray mounted at the tip end driven in the axial direction for conveying a work, but the rod 2 is not limited to the one for conveying the work but it may be an arbitrary working rod by providing various working instrument at the tip end of the rod 2.

Figure 2:
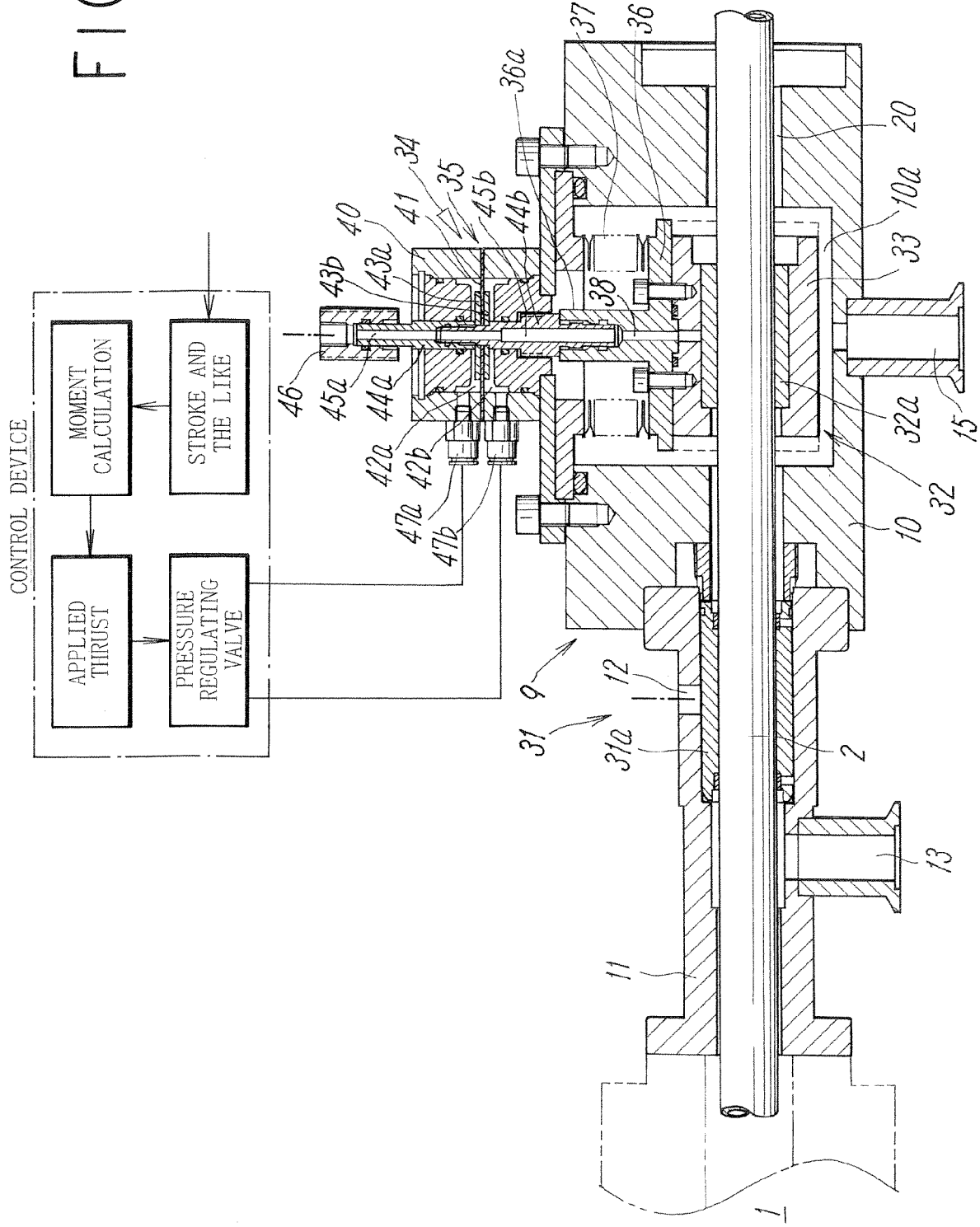
FIG. 2 is a longitudinal sectional view including a control system of the static-pressure gas bearing mechanism according to the embodiment.

The static-pressure gas bearing mechanism 3 supporting the rod 2 is, as clearly shown in FIG. 2, provided with a first and a second static-pressure gas bearings 31, 32 supporting the rod 2 at two locations with an interval in the axial direction, and these gas bearings are supported by a bearing housing 9 made of the support block 10 and the bearing block 11. The first static-pressure gas bearing 31 in them is fixedly supported by the bearing housing 9. That is, the first static-pressure gas bearing 31 is constituted by providing the bearing block 11 protruded from the support block 10 installed on a base, not shown, for the second static-pressure gas bearing 32 toward the front of the rod 2 and by housing a bearing member 31a within this bearing block 11.

The bearing member 31a is made of a porous material and so constructed that a micro clearance is interposed from the rod 2 and the rod is supported in the non-contact manner through an air layer formed in the clearance, and an air supply port 12 for supplying a compressed air for forming the air layer is provided in the bearing block 11.

Also, on the chamber 1 side of the bearing member 31a in the bearing block 11, an exhaust portion provided with a suction port 13 opened for discharging the air supplied from the air supply port 12 by suction is provided.

If appropriate suction is not made at this suction port 13, the air supplied from the air supply port 12 in the first static pressure gas bearing 31 flows into the process chamber 1, which makes maintenance of vacuum in the chamber 1 difficult. Therefore, the process chamber 1 and the inside of the suction port 13 are made to communicate with each other through a micro ventilation section, and the portion of the suction port 13 is, by a vacuum pump connected to the portion, set with a pressure slightly lower than the pressure in the chamber 1 so that the air inflow from the first static-pressure gas bearing 31 into the chamber 1 can be suppressed. As a result, vacuum maintenance in the process chamber 1 is made possible and moreover, cleanliness can be ensured by preventing dust inflow into the process chamber by an exhaust from the suction port 13. Also, the suction from this suction port 13 should be such that the degree of vacuum in the process chamber 1 is ensured and a bearing back pressure is ensured while air is discharged from the first static-pressure gas bearing 31 so as to enable non-contact support of the rod.

On the other hand, the second static-pressure gas bearing 32 is constituted by disposing a bearing block 33 housing the bearing member 32a at a position closer to the rear side of the rod 2 from the first static-pressure gas bearing 31, that is, in a bearing chamber 10a formed within the support block 10 on the side opposite to the process chamber 1 with respect to the first static-pressure gas bearing 31 and is supported by the variable support mechanism 34 capable of vertical displacement.

The bearing member 32a housed in the bearing block 33 is made of a porous material as with the bearing member 31a in the above first static-pressure gas bearing 31, and a micro clearance is interposed from the rod 2 so that the rod 2 is supported in the non-contact manner through the air layer formed in the clearance.

The movable support mechanism 34 is to relatively displace the shaft center of the second static-pressure gas bearing 32 with respect to the first static-pressure gas bearing 31 in a direction to suppress contact of a part of the surface of the rod 2 supported by the first and the second static-pressure gas bearing 31, 32 with the bearing member 31a or 32a in their static-pressure gas bearings 31, 32 according to a fluctuating load (moment) acting on the rod 2, and it is provided with an actuator 35 for the displacement.

When described more specifically, the bearing block 33 of the second static-pressure gas bearing 32 is suspended by a movable seal member 37 around an upper part opening in the bearing chamber 10a in the support block 10 by mounting the movable seal member 37 made of a bellows to the periphery of a connecting member 36 connected to the upper face of the bearing block 33, and by this, a space in the bearing chamber 10a outside the movable seal member 37 is isolated from the outside and connects the space to the vacuum pump by the suction port 15 for exhaust opened in an inner bottom of the bearing chamber 10a.

Also, the connecting member 36 has an air supply port 38 at its center, which communicates with the periphery of the bearing member 32a through the opening of the bearing block 33, and a compressed air for forming the air layer between the bearing member 32a and the surface of the rod 2 is supplied through the air supply port 38. The compressed air supplied into the bearing member 32a through the air supply port 38 and discharged into the bearing chamber 10a is discharged by suction from the suction port 15 but it should be such that the bearing back pressure is ensured while this air discharge is carried out and a pressure relation for enabling non-contact support of the rod 2 can be maintained.

On the support block 10, as mentioned above, the actuator 35 is provided constituting the movable support mechanism 34 for displacing the shaft center of the second static-pressure gas bearing 32. This actuator 35 is provided with pressure chambers 42a, 42b divided vertically by a diaphragm 41 as a pressure receiving member in the housing body 40 fixed on the support block 10, diaphragm shafts 44a, 44b set up on the diaphragm 41 through fixing plates 43a, 43b are slidably supported by the housing body 40 through a seal, and in the diaphragm shafts 44a, 44b, vent holes 45a, 45b communicating with the air supply port 38 provided at the connecting member 36 are provided. At the tip end of the diaphragm shaft 44a leading outside, a joint 46 for connection to a supply source of the compressed air is connected, and the diaphragm shaft 44b extending to the bearing block 33 side has its tip end connected to a projecting shaft portion 36a set up on the connecting member 36. Moreover, the pressure chambers 42a, 42b in the housing body 40 divided by the diaphragm 41 are connected to a pressure regulating valve outputting a fluid pressure controlled by the control device through pipe joints 47a, 47b, respectively.

Therefore, by the movable support mechanism 34, the diaphragm 41 of the actuator 35 is vertically driven by the fluid pressure outputted from the pressure regulating valve, and by a balance of air pressure supplied/discharged to the both face sides of the diaphragm 41, the bearing block 33 is displaced to a control position in the vertical direction through the diaphragm shafts 44a, 44b connected to the diaphragm 41 and the connecting member 36.

The actuator 35 is only necessary to be able to adjust the shaft center of the second static-pressure gas bearing 32 according to the moment amount acting on the rod 2, and therefore, as the pressure receiving member, not only the diaphragm 41 but a cylinder or the like working the controlled fluid pressure on the both sides of the piston may be used.

The control device is to control so that the required fluid pressure is supplied to the pressure chambers 42a, 42b in the actuator 35 by the pressure regulating valve according to the load (moment) acting on the rod 2. The load acting on the rod consists of the weight of a portion of the rod 2 protruding from the static-pressure gas bearing 31 to the process chamber 1 side, fluctuating with the axial driving of the rod 2, and a moment on the basis of the external force acting on the working instrument mounted at the tip end of the rod 2, and it is a moment calculated in advance in the control device according to a driving program of the rod 2 in the control device such as a movement position of the internal moving body 52 in the driving mechanism 5 and the external force applied to the tip end of the rod 2, for example, and the second static-pressure gas bearing 32 has the actuator 35 driven on the basis of the calculation result.

Figure 3:
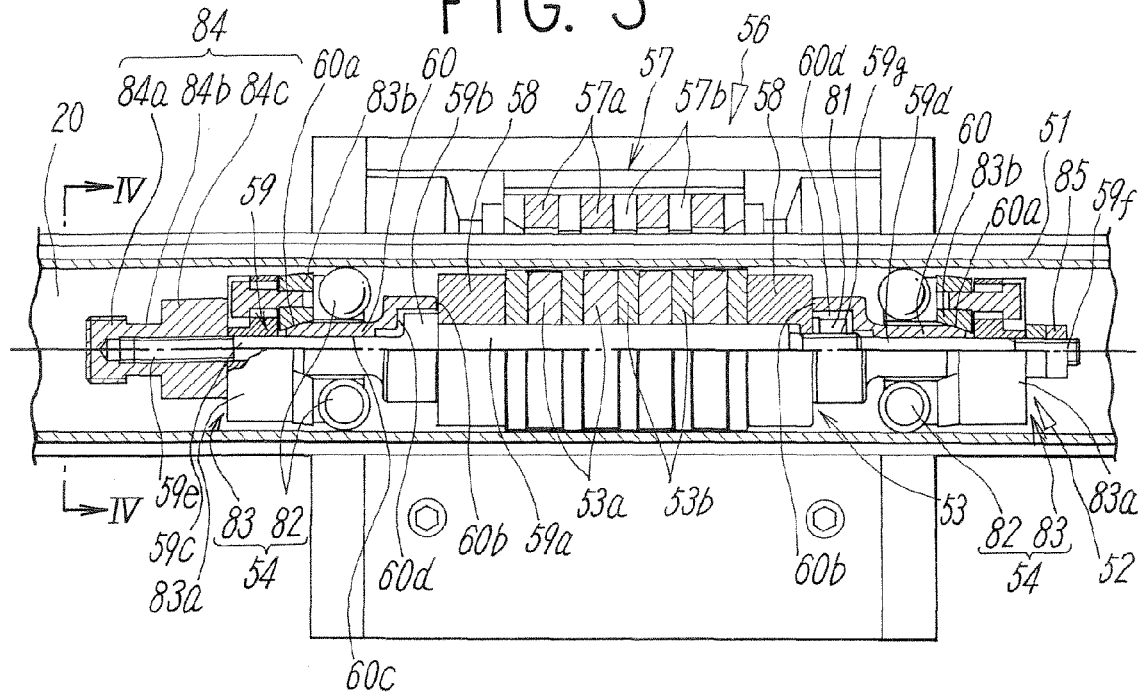
FIG. 3 is a partially enlarged longitudinal sectional view showing a construction of a driving mechanism in the above embodiment.

The magnet coupling type driving mechanism 5 has, as shown in FIGS. 1 and 3, the internal moving body 52 housed in a tube 51 supported by the support member 50 and forming a part of the rod housing cylindrical portion 20 and an external moving body 56 magnetically coupled to the internal moving body 52 provided outside the tube 51.

The external moving body 56 is constructed to be moved in the axial direction along the outer circumferential face of the tube 51 by being driven by appropriate driving means arranged outside the tube. This driving means preferably uses a shock-less actuator which maximizes an average driving speed.

The internal moving body 52 and the external moving body 56 are provided with body portions 53, 57 constructed by laminating ring-state magnets 53a, 57a magnetized in the axial direction and ring-state yokes 53b, 57b alternately and bonding them to each other.

The outer diameter of the ring-state magnet 53a and the yoke 53b in the body portion 53 of the internal moving body 52 is slightly smaller than the inner diameter of the tube 51, and the inner diameter of the ring-state magnet 57a and the yoke 57b in the body portion 57 of the external moving body 56 is slightly larger than the outer diameter of the tube 51.

Therefore, power transmission by the magnet coupling between the internal moving body 52 and the external moving body 56 is carried out in the mutually non-contact state.

When described in more detail, the body portion 53 of the internal moving body 52 has a pair of ring-state end plates 58, 58 holding the alternately laminated ring-state magnet 53a and the yoke 53b in the sandwich state, a shaft 59 penetrating a hole at the center portion of these members and protruding in the axial direction from the both sides of the end plates 58, 58, and a pair of end shaft members 60, 60 fitted with the both ends of the shaft 59, and the diameter of the end plates 58, 58 is slightly smaller than the diameter of the yoke 53b.

Therefore, since the body portion 53 of the internal moving body 52 has its diameter smaller than the inner diameter of the tube 51, the body portion 53 is movable in the non-contact state with respect to the inner circumferential face of the tube 51.

The shaft 59 is made of a single rod comprising a center shaft portion 59a with substantially the same diameter as a hole at the center portions of the ring-state end plates 58, the magnet 53a, the yoke 53b and inserted into these members, a stopper portion 59b adjacent to the left side of the center shaft portion 59a and having a diameter larger than the diameter of the center shaft portion 59a and regulating movement of the end plate 58 on the left side, and a left-side shaft portion 59c and a right-side shaft portion 59d projecting from the left side of the stopper portion 59b and the right side of the center shaft portion 59a, respectively, and having a diameter smaller than the center shaft portion 59a.

The left-side shaft portion 59c and the right-side shaft portion 59d are inserted into the pair of end shaft members 60, 60 and a body member 83a of an adjusting device 83, which will be described later, respectively, and at the tip end portions of the left-side shaft portion 59c and the right-side shaft portion 59d, male screw portions 59e, 59f into which nuts 84, 85 are screwed, which will be described later, are formed, respectively.

Also, at a location of the right-side shaft portion 59d adjacent to the center shaft portion 59a, a male screw portion 59g to which a nut 81 is screwed is formed.

By fitting the left-side end plate 58, alternately laminated ring-state yoke 53b and the ring-state magnet 53a, and the right-side end plate 58 sequentially to the shaft 59 from the right side of the shaft 59 and by fastening these members with the nut 81 screwed to the male screw portion 59g and pressing it to the stopper portion 59b, the members are integrally bonded to the shaft 59.

The end shaft member 60 has an inclined face 60a inclined with respect to the shaft center at one end in the axial direction as well as an end face 60b brought into contact with the end plate 58 at the other end and in its inside, also has a hole to which the shaft 59 is inserted and a space portion 60d in which the stopper portion 59 or the nut 81 is housed.

Also, the internal moving body 52 has a pair of rolling bearing portions 54, 54 in rolling contact with the inner circumferential face of the tube 51 at both ends of the body portion 53 in the axial direction. The rolling bearing portion 54 is provided with a plurality of rolling elements 82 in the roller shape located in the radial state around the end shaft member 60 and in rolling contact with the inner circumferential face of the tube 51, and the adjusting device 83 for moving the rolling element 82 in the radial direction along the inclined face 60a at the tip end of the end shaft member 60.

Figure 4:
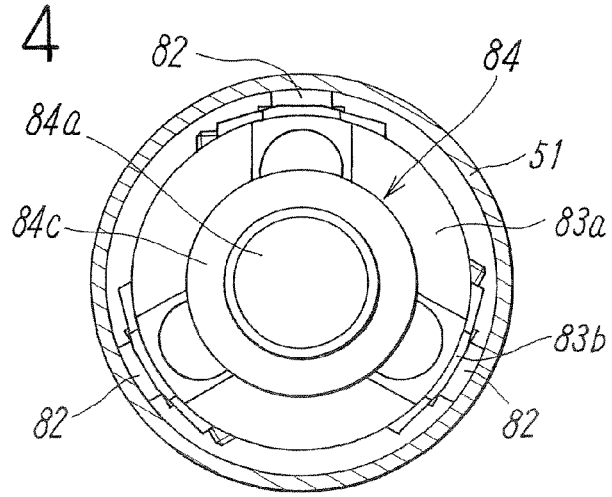
FIG. 4 is a sectional view at VII-VII position in FIG. 3.

Three rolling elements 82 are provided with an equal interval in the circumferential direction in this embodiment as shown in FIG. 4.

Also, the rolling element 82 is given a special surface treatment having an effect to reduce particle generation.

The adjustment device 83 has the circular body member 83a with the left-side shaft portion 59c or the right-side shaft portion 59d of the shaft 59 penetrating the center hole, a plurality of holding members 83b supported by the body member 83a capable of displacement in the radial direction and holding each of the rolling elements 82, and the nuts 84, 85 screwed to the male screw portions 59e, 59f at the tip end of the shaft 59 and pressing the body member 83a in the axial direction. The body member 83a is movable in the axial direction of the shaft 59, and the holding member 83b has an inclined face in slidable contact with the inclined face 60a of the end shaft member 60 and is movable in the radial direction of the body member 83a along this inclined face (that is, the direction crossing the axis of the shaft 59).

The nut 85 is a usual hexagon nut screwed to the male screw portion 59f, and by fastening the hexagon nut with a tool such as a hexagonal wrench, the body member 83a can be moved in the axial direction of the shaft 59. And when the body member 83a is moved in the axial direction, since the holding member 83b is moved in the radial direction of the body member 83a along the inclined face 60a of the end shaft member 60, the rolling element 82 held by the holding member 83b is also moved in the radial direction, by which the clearance between the rolling element 82 and the inner circumferential face of the tube 51, that is, a contact pressure is adjusted.

Also, the nut 84 is a circular nut located on the floating joint 6 side and screwed to the male screw portion 59e, and as shown in FIGS. 3 and 4, it has a head portion 84a having a male screw portion for connection formed on the outer circumferential face, a neck portion 84b with a diameter smaller than the head portion 84a, and a barrel portion 84c provided with a flat portion with a diameter larger than the head portion 84a and for locking a tool for rotating operation at a part on the outer circumferential face, and a female screw portion to which the male screw portion 59e is screwed is formed inside.

The nut 84 can be connected to the floating joint 6 through the head portion 84a, and by locking and rotating the tool such as a wrench at the flat portion of the barrel portion 84c in the state where connection with the floating joint 6 is released so as to move the body member 83a in the axial direction, as mentioned above, the rolling element 82 can be moved by the body member 83a in the radial direction through the holding member 83b and the contact pressure between the rolling element 82 and the inner circumferential face of the tube 51 can be regulated.

In the internal moving body 52 of the driving mechanism 5, since its body portion 53 is not in contact with the inner circumferential face of the tube 51 and the rolling bearing portions 54 at the both ends are in rolling contact with the tube 51 and does not have a portion to slide with respect to the tube 51, friction can be reduced when the internal moving body 52 is moved and dust generation can be suppressed.

Also, since the internal moving body 52 can adjust the clearance between the rolling bearing portions 54, 54 and the inner circumferential face of the tube 51, resistance in the radial direction of the rolling bearing portion 54 of the internal moving body 52 generated by magnet coupling can be adjusted to a small value and thus, dust generation can be further suppressed.

Figure 5:
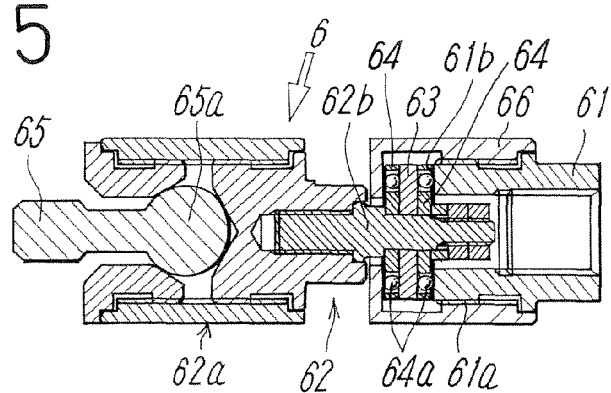
FIG. 5 is a partially enlarged longitudinal sectional view showing a construction of a floating joint in the embodiment.

Moreover, the floating joint 6 connecting the internal moving body 52 and the rod 2 comprises, as shown in detail in FIG. 5, the cylindrical connecting member 61 screwed and bonded to the nut 84 of the rolling bearing portion 54 located on one end side of the internal moving body 52, the parallel moving plate 63 held between the connecting member 61 and the cap 66 movably in the direction crossing the axis of the connecting member 61, a joint member 62 moving in the direction crossing the shaft center of the connecting member 61 integrally with the parallel moving plate 63 by being connected to the parallel moving plate 63 through a connecting shaft 62b, and an oscillation shaft 65 connected to an oscillation shaft holding portion 62a of the joint member 62 capable of oscillation.

The parallel moving plate 63 is held by a rolling member 64 having a plurality of balls 64a held by retainers from the both sides and housed so as to be displaced together with the rolling member 64 in the cap 66 in the cylindrical state with a bottom screwed to the end of the connecting member 61.

The cap 66 has an opening at its bottom portion wall through which the connecting shaft 62b of the joint member 62 can be inserted easily, and by being screwed to the male screw portion 61a on the outer circumference of the connecting member 61 and by holding the parallel moving plate 63 and the rolling members 64 on its both sides between the bottom portion wall and the end face 61b of the connecting member 61, the joint member 62 is held capable of parallel movement in the direction crossing the axis of the connecting member 61.

Also, the joint member 62 has the oscillation shaft holding portion 62a rotatably holding a ball portion 65a of the oscillation shaft 65 and the connecting shaft 62b connecting the oscillation shaft holding portion 62a to the parallel moving plate 63, and this oscillation shaft 65 is connected to the end of the rod 2.

An oscillation portion of the floating joint 6 is constructed by the oscillation shaft 65 and the oscillation shaft holding portion 62a of the joint member 62, the parallel movement portion of the floating joint 6 is constructed by the parallel moving plate 63, and the oscillation portion and the parallel movement portion are connected to each other by the connecting shaft 62b of the joint member 62.

By interposing the floating joint 6 between the internal moving body 52 of the driving mechanism 5 and the rod 2, axial displacement between the rod 2 supported by the static-pressure gas bearing 31, 32 and the internal moving body 52 mechanically bound with the rolling bearing portion 54 in rolling contact with the inner circumferential face of the tube 51 can be absorbed. Also, even increase in the deflection amount or drop in straight traveling degree when the rod 2 is long, freedom required for non-contact support is ensured since the shaft center can be easily ensured with respect to the static-pressure gas bearings 31, 32. If such a necessity to ensure the shaft center is low, this floating joint 6 may be omitted.

Figure 6:
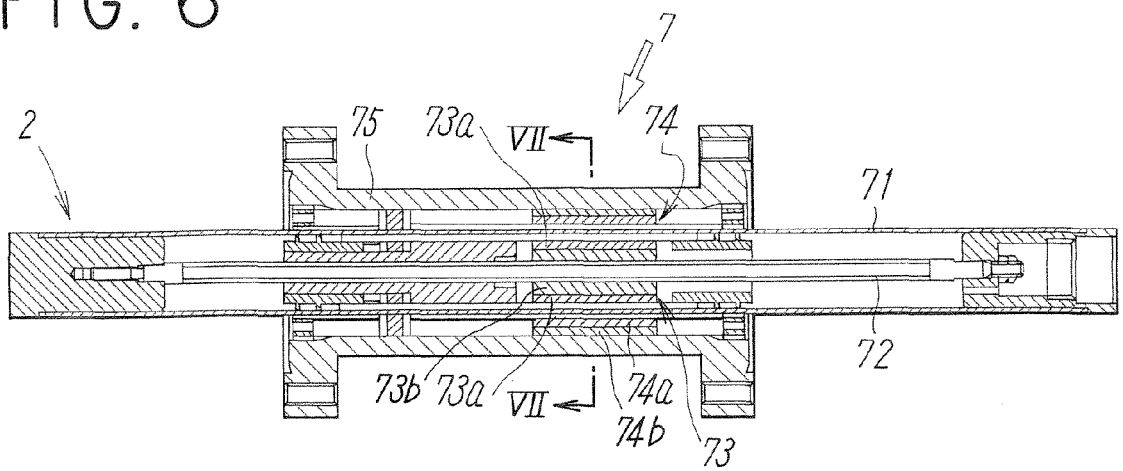
FIG. 6 is a partially enlarged longitudinal sectional view showing a construction of a rotation suppression mechanism in the embodiment.
Figure 7:
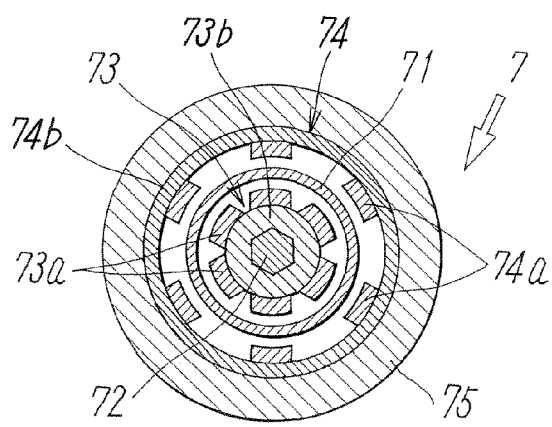
FIG. 7 is a sectional view at VII-VII position in FIG. 6.

Also, the rod 2 is provided with the rotation suppression mechanism 7 for suppressing its rotation. This rotation suppression mechanism 7 is, as shown in FIGS. 6 and 7, disposed at a hollow shaft portion 71 h a circular section formed at the rod 2 for suppressing the rotation of the rod 2 by a magnetic attracting force of an internal magnet assembly 73 mounted to the rod 2 side in the hollow shaft portion 71 and an external magnet assembly 74 provided at a cylindrical housing 75 fixed to the support member 50 outside the hollow shaft portion 71.

More specifically, inside the hollow shaft portion 71, a spline shaft 72 is connected to be integral with the rod 2, and a columnar magnet holder 73b is attached to the spline shaft 72 in the state where it is slidable in the axial direction with respect to the spline shaft 72 but mutually fixed in the rotating direction. And by mounting a plurality of internal magnets 73a on the outer circumference of the magnet holder 73b, the internal magnet assembly 73 is formed. On the other hand, outside the hollow shaft portion 71, the cylindrical housing 75 is fixed between the support block 10 in the second static-pressure gas bearing 32 and the support member 50 in the driving mechanism 5, and by mounting a plurality of external magnets 74a within this cylindrical housing 75 through a cylindrical magnet holder 74b, the external magnet assembly 74 is constructed.

The internal magnets 73a and the external magnets 74a are provided in the same number and occupy positions opposing each other.

Therefore, even if the rod 2 is driven in the axial direction by the driving mechanism 5, rotation of the rod 2 is suppressed by magnetic coupling of the external magnet assembly 74 and the internal magnet assembly 73 moving on the spline shaft 72 to a position corresponding to it.

As the spline shaft 72, a hexagon shaft is shown in the illustrated example, but a key way in the axial direction may be provided, and in this case, a key to be fitted with this key way is formed in the magnet holder 73b.

In this way, by fixedly installing the external magnet assembly 74 without contact with the hollow shaft portion 71 of the rod 2, the rotation suppression of the rod 2 in the non-contact manner is made possible. But if the external magnet assembly 74 is constructed to be rotated around the hollow shaft portion 71 of the rod 2, the rod can be rotated following it, and reversing or the like of a work within the process chamber 1 is made possible.

Figure 8:
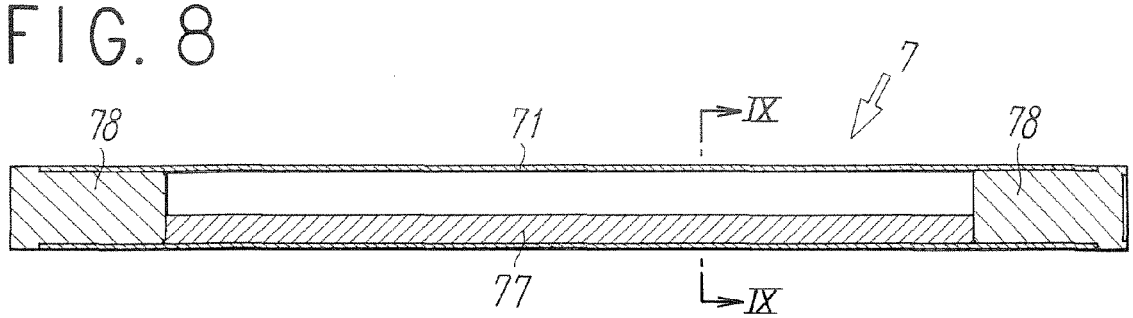
FIG. 8 is a longitudinal sectional view showing another embodiment of the rotation suppression mechanism.
Figure 9:
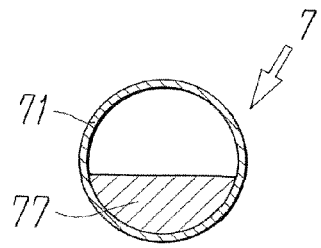
FIG. 9 is an enlarged sectional view at IX-IX position in FIG. 6.

FIGS. 8 and 9 show views of another embodiment of the rotation suppression mechanism 7.

The rotation suppression mechanism 7 comprises a weight 77 with a section in the notched circular state eccentrically disposed in the hollow shaft portion 71 with a circular section in the rod 2 and extending in the axial direction, and the weight 77 is fixed eccentrically from the axis in the hollow shaft portion 71 by being held from the both sides by a pair of fixing plugs inserted into the both ends of the hollow shaft portion 71.

In this rotation suppression mechanism 7, since the weight 77 is eccentrically disposed in the hollow shaft portion 71 of the conveying rod 2, the rotation can be suppressed even if a rotation behavior is generated in the conveying rod 2, and even if the rod 2 is rotated, the rotated rod 2 can be automatically restored to the original state based on the principle similar to that of a tumble doll.

In the above straight conveying device for vacuum, since the conveying rod 2 having one end side inserted into the vacuum process chamber 1 is conveyed in the non-contact manner and power transmission to the internal moving body 52 of the driving mechanism 5 for driving the conveying rod 2 is carried out in the non-contact manner by magnetic coupling, friction by contact of the conveying rod 2 and the driving mechanism 5 for driving the conveying rod 2 can be suppressed, and thus, dust generation at the conveying rod 2 and the driving mechanism 5 of the conveying rod 2 can be suppressed and driving speed of the conveying rod 2 can be improved.

Also, in the straight conveying device for vacuum, the conveying rod 2 and the internal moving body 52 of the driving mechanism 5 driving the conveying rod 2 are housed movably in the rod housing cylindrical portion 20, and an exhaust portion made of the suction ports 13, 15 are formed at positions between the first static-pressure gas bearing 31 at least closer to the vacuum process chamber 1 in the two static-pressure gas bearings 31, 32 and the vacuum process chamber so that the pressure in the rod housing cylindrical portion 20 is made lower than the pressure of the vacuum process chamber 1 by the exhaust from this exhaust portion, even if dust is generated by driving of the conveying rod 2 by the driving mechanism 5, the dust can be fully eliminated from the exhaust portion, and the dust will not flow into the vacuum process chamber 1.

The straight conveying device for vacuum according to the present invention has been described above in detail, but the present invention is not necessarily limited to the above embodiment.

For example, in the above embodiment, the rolling member 82 is given special surface treatment having an effect to reduce particle generation, but the special surface treatment having the particle-generation reduction effect may be applied to another spot where friction might occur.

Also, in the above embodiment, the exhaust portion (suction ports 13, 15) is provided in the vicinity of the static-pressure gas bearing in the rod housing cylindrical portion to which a vacuum pump is connected for vacuum exhaust, but the exhaust portion may be provided at another location, and the exhaust portion may be provided at a portion in the vicinity of the driving mechanism 5 where dust might be generated, for example, so as to evacuate the gas including the dust.

The invention claimed is:

1. A straight conveying device for vacuum comprising:
    a working rod with a tip end extending into a vacuum process chamber and movable in the axial direction,
    two static-pressure gas bearings supporting the rod in a non-contact manner through an air layer,
    an internal moving body of a magnet coupling type driving mechanism driving the working rod, said working rod, said bearings and said internal moving body being housed in the interior of a rod housing cylindrical portion which is in fluid communication with the vacuum process chamber and fluidically isolated from an external environment, and
    an exhaust portion having suction and provided at a part of the rod housing cylindrical portion,
    wherein the driving mechanism has an external moving body driven by driving means and moved in the axial direction outside the rod housing cylindrical portion and the internal moving body connected to the conveying rod to be magnetically coupled to the external moving body and moved following the external moving body by transmission of a driving force of the external moving body in the non-contact manner, and wherein the exhaust portion is provided at a position between the vacuum process chamber and the static-pressure gas bearings so that a pressure in the rod housing cylindrical portion is lowered by an exhaust of the exhaust portion relative to the pressure of the vacuum process chamber.

2. A straight conveying device for vacuum comprising:

a working rod with a tip end extending into a vacuum process chamber and movable in the axial direction;

two static-pressure gas bearings supporting the working rod in a non-contact manner through an air layer;

an internal moving body of a magnet coupling type driving mechanism driving the rod housed in a rod housing cylindrical portion leading to the vacuum process chamber; and an exhaust portion having suction and provided at a part of the rod housing cylindrical portion, wherein the driving mechanism has an external moving body driven by driving means and moved in the axial direction outside the rod housing cylindrical portion and the internal moving body connected to the conveying rod to be magnetically coupled to the external moving body and moved following the external moving body by transmission of a driving force of the external moving body in the non-contact manner, wherein the exhaust portion is provided at a position between the vacuum process chamber and the static-pressure gas bearings so that a pressure in the rod housing cylindrical portion is lowered by an exhaust of the exhaust portion relative to the pressure of the vacuum process chamber, wherein the internal moving body has a body portion to which a magnet for magnetic coupling is attached and disposed in the non-contact state with the inner circumferential face of the rod housing cylindrical portion and a rolling bearing portion provided on both sides of the body portion in the axial direction in rolling contact with the inner circumferential face of the rod housing cylindrical portion.

3. The straight conveying device according to claim 2, wherein the rolling bearing portion has a plurality of rolling elements disposed in the radial state around the axis of the body portion and in rolling contact with the inner circumferential face of the rod housing cylindrical portion and these rolling elements are disposed capable of movement adjustment in the radial direction of the body portion so that the contact pressure on the inner circumferential face can be adjusted by the movement adjustment.

4. The straight conveying device according to claim 2, wherein the rod and the internal moving body are connected by a floating joint, and the floating joint has a joint member connected to one of the rod or the internal moving body capable of displacement in the direction crossing the shaft center and an oscillation shaft connected to the other and bonded to this joint member capable of oscillation.

5. The straight conveying device according to claim 2, wherein the straight conveying device for vacuum has a rotation suppression mechanism for suppressing rotation of the rod.

6. The straight conveying device according to claim 5, wherein the rotation suppression mechanism has an internal magnet mounted on the rod side and an external magnet mounted on the rod housing cylindrical portion side and is constructed so that magnetic attracting force of the internal magnet and the external magnet suppresses rotation of the rod.

7. The straight conveying device according to claim 5, wherein the rotation suppression mechanism is constructed by a weight mounted to the rod in the eccentric state.

8. The straight conveying device according to claim 2, wherein the first static-pressure gas bearing in the above two static-pressure gas bearings is fixedly supported by a bearing housing forming the rod housing cylindrical portion, while the other second static-pressure gas bearing is supported by the bearing housing, capable of displacement in the direction crossing the axis of the rod through the actuator, so that by displacing the shaft center of the second static-pressure gas bearing with respect to the first static-pressure gas bearing, contact of the rod with the both static-pressure gas bearings can be prevented.

9. A straight conveying device for vacuum comprising:

a working rod with a tip end extending into a vacuum process chamber and movable in the axial direction;

two static-pressure gas bearings supporting the working rod in a non-contact manner through an air layer;

an internal moving body of a magnet coupling type driving mechanism driving the rod housed in a rod housing cylindrical portion leading to the vacuum process chamber; and an exhaust portion having suction and provided at a part of the rod housing cylindrical portion, wherein the driving mechanism has an external moving body driven by driving means and moved in the axial direction outside the rod housing cylindrical portion and the internal moving body connected to the conveying rod to be magnetically coupled to the external moving body and moved following the external moving body by transmission of a driving force of the external moving body in the non-contact manner, wherein the exhaust portion is provided at a position between the vacuum process chamber and the static-pressure gas bearings so that a pressure in the rod housing cylindrical portion is lowered by an exhaust of the exhaust portion relative to the pressure of the vacuum process chamber, wherein the rod and the internal moving body are connected by a floating joint, and the floating joint has a joint member connected to one of the rod or the internal moving body capable of displacement in the direction crossing the shaft center and an oscillation shaft connected to the other and bonded to this joint member capable of oscillation.

10. The straight conveying device according to claim 9, wherein the first static-pressure gas bearing in the above two static-pressure gas bearings is fixedly supported by a bearing housing forming the rod housing cylindrical portion, while the other second static-pressure gas bearing is supported by the bearing housing, capable of displacement in the direction crossing the axis of the rod through the actuator, so that by displacing the shaft center of the second static-pressure gas bearing with respect to the first static-pressure gas bearing, contact of the rod with the both static-pressure gas bearings can be prevented.

11. A straight conveying device for vacuum comprising:

a working rod with a tip end extending into a vacuum process chamber and movable in the axial direction, two static-pressure gas bearings supporting the working rod in a non-contact manner through an air layer;

an internal moving body of a magnet coupling type driving mechanism driving the rod housed in a rod housing cylindrical portion leading to the vacuum process chamber; and an exhaust portion having suction and provided at a part of the rod housing cylindrical portion, wherein the driving mechanism has an external moving body driven by driving means and moved in the axial direction outside the rod housing cylindrical portion and the internal moving body connected to the conveying rod to be magnetically coupled to the external moving body and moved following the external moving body by transmission of a driving force of the external moving body in the non-contact manner, wherein the exhaust portion is provided at a position between the vacuum process chamber and the static-pressure gas bearings so that a pressure in the rod housing cylindrical portion is lowered by an exhaust of the exhaust portion relative to the pressure of the vacuum process chamber, wherein the straight conveying device for vacuum has a rotation suppression mechanism for suppressing rotation of the rod.

12. The straight conveying device according to claim 11, wherein the rotation suppression mechanism has an internal magnet mounted on the rod side and an external magnet mounted on the rod housing cylindrical portion side and is constructed so that magnetic attracting force of the internal magnet and the external magnet suppresses rotation of the rod.

13. The straight conveying device according to claim 11, wherein the rotation suppression mechanism is constructed by a weight mounted to the rod in the eccentric state.

14. A straight conveying device for vacuum comprising:

a working rod with a tip end extending into a vacuum process chamber and movable in the axial direction;

two static-pressure gas bearings supporting the working rod in a non-contact manner through an air layer;

an internal moving body of a magnet coupling type driving mechanism driving the rod housed in a rod housing cylindrical portion leading to the vacuum process chamber; and an exhaust portion having suction and provided at a part of the rod housing cylindrical portion, wherein the driving mechanism has an external moving body driven by driving means and moved in the axial direction outside the rod housing cylindrical portion and the internal moving body connected to the conveying rod to be magnetically coupled to the external moving body and moved following the external moving body by transmission of a driving force of the external moving body in the non-contact manner, wherein the exhaust portion is provided at a position between the vacuum process chamber and the static-pressure gas bearings so that a pressure in the rod housing cylindrical portion is lowered by an exhaust of the exhaust portion relative to the pressure of the vacuum process chamber, wherein the first static-pressure gas bearing in the above two static-pressure gas bearings is fixedly supported by a bearing housing forming the rod housing cylindrical portion, while the other second static-pressure gas bearing is supported by the bearing housing, capable of displacement in the direction crossing the axis of the rod through an actuator, so that by displacing the shaft center of the second static-pressure gas bearing with respect to the first static-pressure gas bearing, contact of the rod with the both static-pressure gas bearings can be prevented.

* * * * *